United States Patent
Cheng et al.

(10) Patent No.: US 9,508,810 B1
(45) Date of Patent: Nov. 29, 2016

(54) FET WITH AIR GAP SPACER FOR IMPROVED OVERLAP CAPACITANCE

(71) Applicant: International Business Machines Corporation, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/941,853

(22) Filed: Nov. 16, 2015

(51) Int. Cl.
*H01L 29/06* (2006.01)
*H01L 29/417* (2006.01)
*H01L 29/49* (2006.01)
*H01L 21/764* (2006.01)
*H01L 29/66* (2006.01)
*H01L 21/02* (2006.01)
*H01L 29/08* (2006.01)
*H01L 29/78* (2006.01)

(52) U.S. Cl.
CPC ... *H01L 29/41783* (2013.01); *H01L 21/02274* (2013.01); *H01L 21/02532* (2013.01); *H01L 29/0649* (2013.01); *H01L 29/0847* (2013.01); *H01L 29/4991* (2013.01); *H01L 29/6656* (2013.01); *H01L 29/66545* (2013.01); *H01L 29/78* (2013.01)

(58) Field of Classification Search
CPC .................. H01L 29/41783; H01L 29/66545; H01L 29/78; H01L 29/6656; H01L 29/0649; H01L 21/02274; H01L 21/02532; H01L 29/4991; H01L 21/764
See application file for complete search history.

(56) References Cited

U.S. PATENT DOCUMENTS

| | | | |
|---|---|---|---|
| 6,127,251 A | 10/2000 | Gardener et al. | |
| 6,238,987 B1 | 5/2001 | Lee | |
| 6,468,877 B1* | 10/2002 | Pradeep | H01L 21/764 257/E21.573 |
| 6,596,599 B1* | 7/2003 | Guo | H01L 21/28114 257/E21.205 |
| 6,891,235 B1* | 5/2005 | Furukawa | H01L 21/26586 257/408 |
| 6,894,357 B2 | 5/2005 | Guo | |
| 7,078,284 B2 | 7/2006 | Trivedi | |
| 7,282,423 B2 | 10/2007 | Furukawa et al. | |
| 7,691,712 B2 | 4/2010 | Chidambarrao et al. | |
| 9,059,139 B2 | 6/2015 | Adam et al. | |
| 9,331,072 B2* | 5/2016 | Seo | H01L 27/088 |
| 2008/0042220 A1 | 2/2008 | Hwang | |
| 2008/0242094 A1* | 10/2008 | Trivedi | H01L 21/31111 438/696 |
| 2013/0292747 A1* | 11/2013 | Kang | H01L 21/28255 257/288 |
| 2013/0299920 A1* | 11/2013 | Yin | H01L 29/78 257/408 |
| 2014/0264729 A1* | 9/2014 | Lee | H01L 21/76805 257/522 |
| 2014/0327054 A1* | 11/2014 | Adam | H01L 29/6656 257/288 |

* cited by examiner

*Primary Examiner* — Christine Enad
(74) *Attorney, Agent, or Firm* — Cantor Colburn LLP; Bryan Bortnick

(57) ABSTRACT

A semiconductor device and method of forming a semiconductor device including a semiconductor substrate, a gate stack extending from the semiconductor substrate, wherein the gate stack includes a gate conductor layer, and at least two gate spacers adjacent to each side of the gate stack. The semiconductor device also includes a source/drain region on each side of the spacers, wherein the source/drain regions are adjacent to the semiconductor substrate, an ILD layer adjacent to outer surfaces of the two spacers, wherein a height of the ILD layer is level with a height of the gate stack, and an air gap positioned beneath each spacer.

19 Claims, 8 Drawing Sheets

FET WITH AIR GAP SPACER FOR IMPROVED OVERLAP CAPACITANCE

BACKGROUND

The present invention relates to integrated circuit chips, and more specifically, to field effect transistors (FET) with improved capacitance.

The speed of an FET is largely determined by the distance across the gate. Transistors with a shorter gate conductor distance have a shorter spacing between source and drain and are generally faster. The industry has moved to photolithography equipment that provides a shorter wavelength of light and a higher numerical aperture lens with each generation of integrated circuits to permit decreasing this dimension of the gate. However, these changes have frequently increased cross chip line width variation. Furthermore, these changes have resulted in higher gate resistance.

Further, as semiconductor device dimensions shrink, the adverse impact of parasitics such as gate-to-contact parasitic capacitance and fringing capacitance on device performance becomes more and more severe, particularly for semiconductor devices with raised source/drain (RSD). Reducing parasitic capacitance is critical for improving circuit performance while maintaining low power.

SUMMARY

According to one embodiment, a method of forming a transistor device is provided. The method includes providing a semiconductor substrate; forming a dummy oxide layer on at least a portion of the semiconductor substrate; forming a dummy gate stack on a portion of the dummy oxide layer; forming gate spacers adjacent to the dummy gate stack; removing a portion of the dummy oxide layer on each side of the gate spacers forming a remaining portion of the dummy oxide layer positioned beneath the dummy gate stack; forming a source/drain region on each side of the gate spacers; depositing an interlayer dielectric (ILD) layer on both sides of the gate spacers; removing the dummy gate stack; removing the remaining portion of the dummy oxide layer to form an exposed surface of the semiconductor substrate, wherein the exposed surface extends below a portion of each gate spacer; applying a low-k pinched off dielectric layer to the exposed surface of the semiconductor substrate, wherein an air gap is formed between the source/drain region and the low-k pinched off dielectric layer; removing a portion of the low-k pinched off dielectric layer between the gate spacers; and forming a replacement gate stack between the gate spacers.

According to one embodiment, a semiconductor device is provided. The transistor includes a semiconductor substrate; a gate stack extending from the semiconductor substrate, wherein the gate stack includes a gate conductor layer; at least two gate spacers adjacent to each side of the gate stack a source/drain region on each side of the spacers, wherein the source/drain regions are adjacent to the semiconductor substrate; an ILD layer adjacent to outer surfaces of the two spacers, wherein a height of the ILD layer is level with a height of the gate stack; an air gap positioned beneath each spacer; and a low-k pinched off dielectric layer positioned between the semiconductor substrate and a bottom surface of each of the two gate spacers, wherein each air gap is positioned between a bottom surface of each gate spacer, the low-k pinched off dielectric layer, the semiconductor substrate, and the source/drain regions.

According to one embodiment, a semiconductor device is provided. The transistor includes a semiconductor substrate; a gate stack extending from the semiconductor substrate, wherein the gate stack includes a gate conductor layer; at least two gate spacers adjacent to each side of the gate stack; a source/drain region on each side of the spacers, wherein the source/drain regions are adjacent to the semiconductor substrate; an ILD layer adjacent to outer surfaces of the two spacers, wherein a height of the ILD layer is level with a height of the gate stack; and an air gap positioned beneath each spacer.

BRIEF DESCRIPTION OF THE DRAWINGS

FIG. 2 through FIG. 14 illustrate an exemplary fabrication process of forming a semiconductor device according to an embodiment, in which:

FIG. 2 is a cross-sectional view illustrating dummy oxide layer formation on a semiconductor substrate according to an embodiment;

FIG. 3 is a cross-sectional view of the semiconductor device illustrating the formation of a dummy gate stack according to an embodiment;

FIG. 4 is a cross-sectional view of the semiconductor device illustrating depositing gate spacers along the outer surface of the dummy gate stack according to an embodiment;

FIG. 5 is a cross-sectional view of the semiconductor device illustrating removal of a portion of the dummy oxide layer according to an embodiment;

FIG. 6 is a cross-sectional view of the semiconductor device illustrating the formation of the source/drain regions according to an embodiment;

FIG. 7 is a cross-sectional view of the semiconductor device illustrating the formation of dopant drive-ins according to an embodiment;

FIG. 8 is a cross-sectional view of the semiconductor device illustrating deposition of an ILD layer according to an embodiment;

FIG. 9 is a cross-sectional view of the semiconductor device illustrating removal of a high mobility channel according to an embodiment;

FIG. 10 is a cross-sectional view of the semiconductor device illustrating removal of the dummy gate stack according to an embodiment;

FIG. 11 is a cross-sectional view of the semiconductor device illustrating removal of the dummy oxide layer according to an embodiment;

FIG. 13 is a cross-sectional view of the semiconductor device illustrating removal a portion of the low-k pinched off dielectric layer according to an embodiment; and FIG. 14 is a cross-sectional view of the semiconductor device illustrating depositing a replacement gate stack, specifically, the deposition of the gate dielectric layer, according to an embodiment.

DETAILED DESCRIPTION

Figure 1:
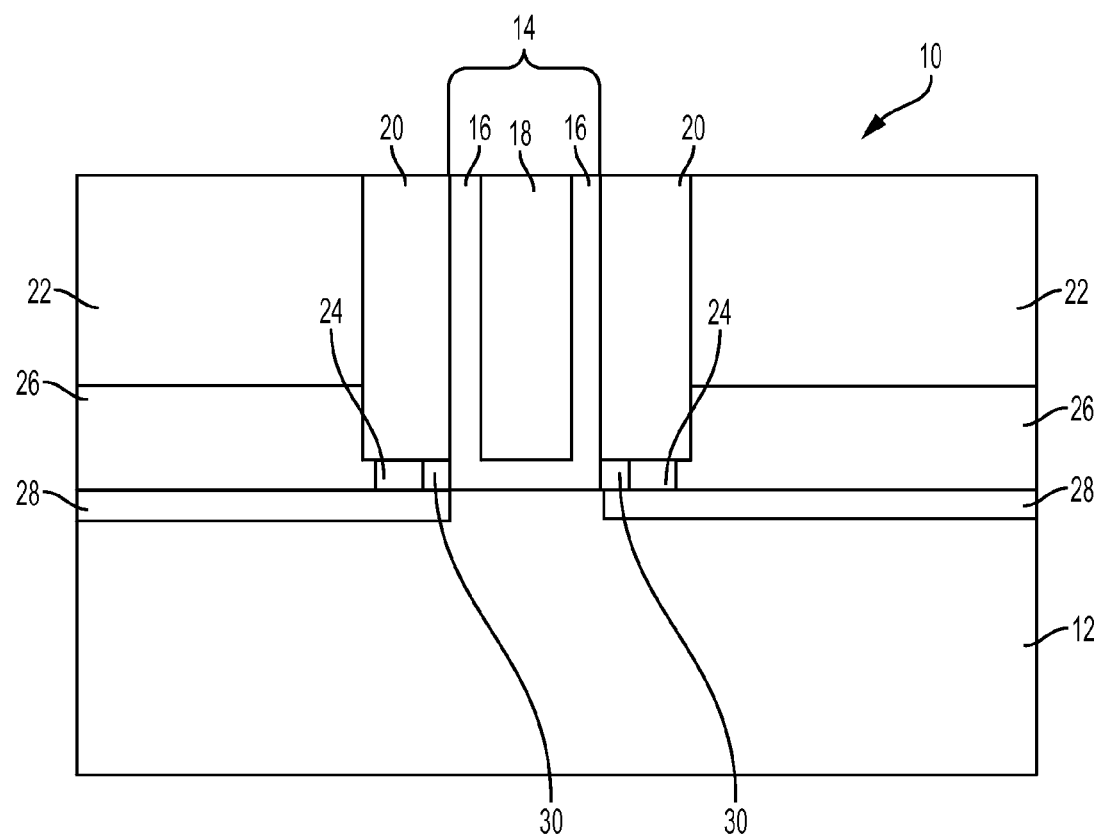
FIG. 1 is a cross-sectional view illustrating a semiconductor device according to an embodiment.

The embodiments of the present invention relate generally to the fabrication of integrated circuits, and more particularly to a structure and method for fabricating a dielectric spacer and air-gap spacer in a semiconductor device. A semiconductor device is comprised of an intrinsic semiconductor material that has been doped, i.e., into which a doping agent has been introduced, to turn it into an extrinsic semiconductor having different electrical properties than the intrinsic semiconductor. Doping involves adding dopant atoms to an intrinsic semiconductor, which changes the electron and hole carrier concentrations of intrinsic semiconductor at thermal equilibrium. Dominant carrier concentration in an extrinsic semiconductor determines the conductivity type of the semiconductor.

A field effect transistor (FET) is a semiconductor device in which output current, i.e., source-drain current, is controlled by the voltage applied to a gate portion. A FET has three terminals: a gate portion, source, and drain. The gate portion is used to control output current, i.e., flow of carriers in the channel, of a semiconductor device through electrical or magnetic fields. The channel region is located between the source and drain of the semiconductor device that becomes conductive when the semiconductor device is turned out. The source region is a doped region, in which majority carriers are flowing into the channel. The drain region is a doped region located on the other side of the channel region, in which carriers are flowing into from the channel region. The term "raised," as used herein to describe a RSD region has an upper surface that is vertically offset and above the upper surface of the semiconductor substrate. A "low-k" material as used herein is a dielectric material with a small dielectric constant relative to silicon dioxide ($SiO_2$), which is 3.9. This number is the ratio of the permittivity of $SiO_2$ divided by the permittivity of a vacuum. An "air gap" as used herein is a volume of a gas that has a dielectric constant of less than 2.0, as measured at 1 atmospheric pressure (atm) at room temperature, and preferably has a dielectric constant of about 1.0.

In an embodiment, the positioning of the air gap spacer between the spacer and the semiconductor substrate reduces the fringe capacitance of the device when compared to similar semiconductor devices. The fringe capacitance is the measurement of the capacitance formed between the gate conductor and the RSD regions, in addition to the capacitance that is formed between the gate portion and the portion of the RSD extensions that extend under the gate spacers.

The present semiconductor device includes a gate stack including a gate electrode flanked by two spacers, wherein the spacers are formed on the vertical surfaces of the gate portion, separating the gate portion from the RSD regions. The spacers may be dielectric spacers that have a dielectric constant of 2.25 or greater, ranging from about 3.9 to about 7.5, as measured at 1 atm at room temperature.

The relatively high dielectric constant of the spacers may create a high capacitance between the gate electrode and the RSD regions. By utilizing epitaxial RSD regions and creating an air gap between the gate spacers and the epitaxial RSD region, the present transistor device may reduce the parasitic capacitance between the RSD regions and the gate portion, therefore, reducing fringe capacitance.

Referring to FIG. 1, a semiconductor device 10 according to one embodiment may include a semiconductor substrate 12, a gate stack 14 including a gate dielectric outer layer 16 and a gate conductor inner layer 18, at least two spacers 20 on each side of the gate stack 14, a source/drain region 26 on each side of the gate stack 14, a dopant drive-in 28 adjacent to each of the source/drain region 26, an ILD layer 22 surrounding the spacers, and an air gap 24 positioned beneath each spacer.

The semiconductor substrate 12 may be a silicon containing material. For example, the semiconductor substrate 12 may include Si, SiGe, SiGeC, Si:C, polysilicon, epitaxial Si, amorphous Si, and multi-layers thereof. Although Si is the predominately used semiconductor material in wafer fabrication, other materials may be used including, but not limited to, germanium, gallium arsenide, gallium nitride, cadmium telluride, and zinc selenide.

The semiconductor substrate 10 may be a semiconductor on insulator (SOI) substrate. SOI substrates are typically composed of at least a first semiconductor layer overlying a dielectric layer. A second semiconductor layer may be present underlying the dielectric layer. The first semiconductor layer and the second semiconductor layer may comprise any of the following materials, including, but not limited to, Si, strained Si, Si:C, SiGe, SiGeC, Si alloys, Ge, Ge alloys, GaAs, InAs, InP, or combinations thereof.

Figure 2:
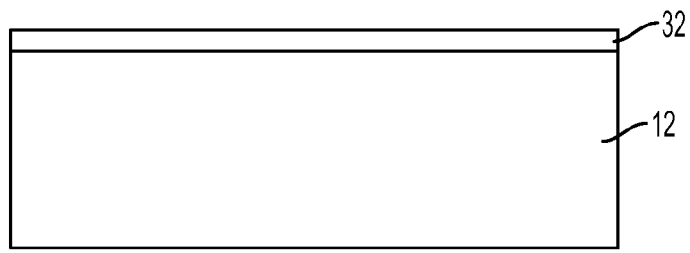

An embodiment of the method of forming the semiconductor device is illustrated in FIGS. 2-12. As illustrated in FIG. 2, the method may include depositing a dummy oxide layer 32 on the semiconductor substrate 12. The dummy oxide layer 32 may be any suitable oxide layer that may be removed later in the process. In an example, the dummy oxide layer 32 may include $SiO_2$, $GeO_2$, $Al_2O_3$, or combinations thereof. The dummy oxide layer 32 may have a thickness of about 2 nm to about 8 nm, for example, about 3 nm to about 6 nm.

Figure 3:
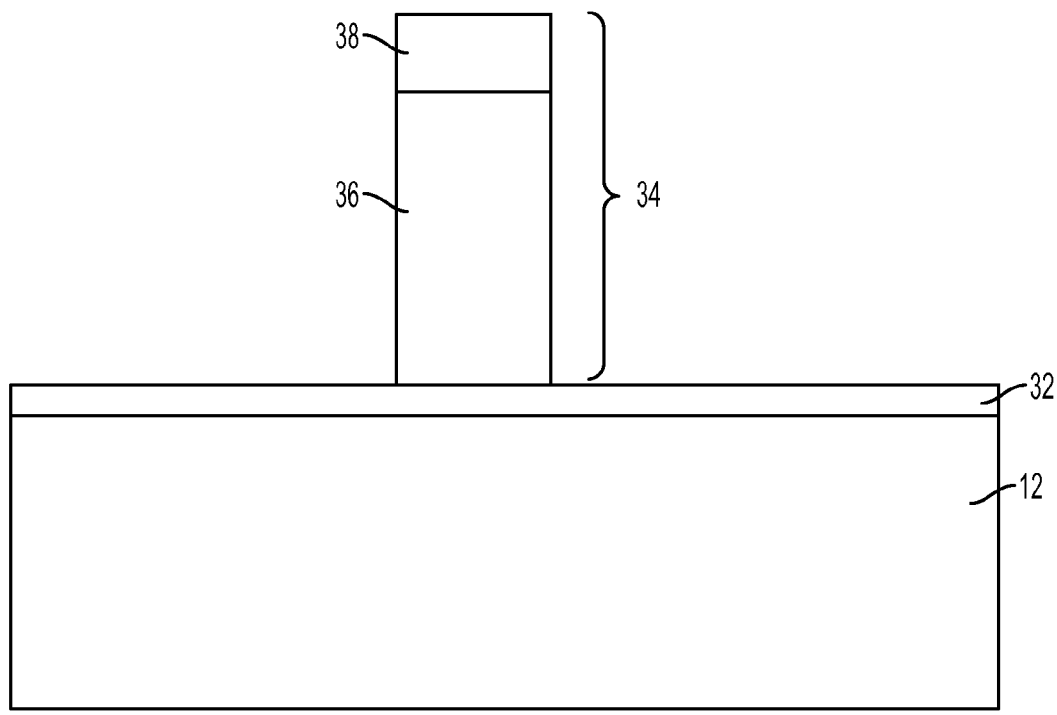

The method also includes forming a dummy gate stack 34 on the dummy oxide 32, as shown in FIG. 3. In an example, the dummy oxide layer 32 may include material that may be selectively removed without removing the dummy gate stack 34. The dummy gate stack 34 may be any suitable material that may be selectively removed. In an example, the dummy gate stack includes an oxide, nitride, or oxynitride. The dummy gate stack 34 may include a dummy gate stack base 36 including a silicon based material, such as polysilicon, for example amorphous silicon or polycrystalline silicon. In an example, the dummy gate stack 34 includes a high mobility channel layer 38 on an upper surface of the dummy gate stack base 36. The high mobility channel layer 38 may include any suitable high mobility channel material, for example, $Si_3N_4$.

The dummy gate stack 34 may be formed using deposition, photolithography, and selective etch processes. The dummy gate stack 34 may be patterned and etched. For example, the dummy gate stack 34 may be patterned by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process. In an example, the dummy gate stack 34 is formed by reactive ion etching (RIE).

Figure 4:
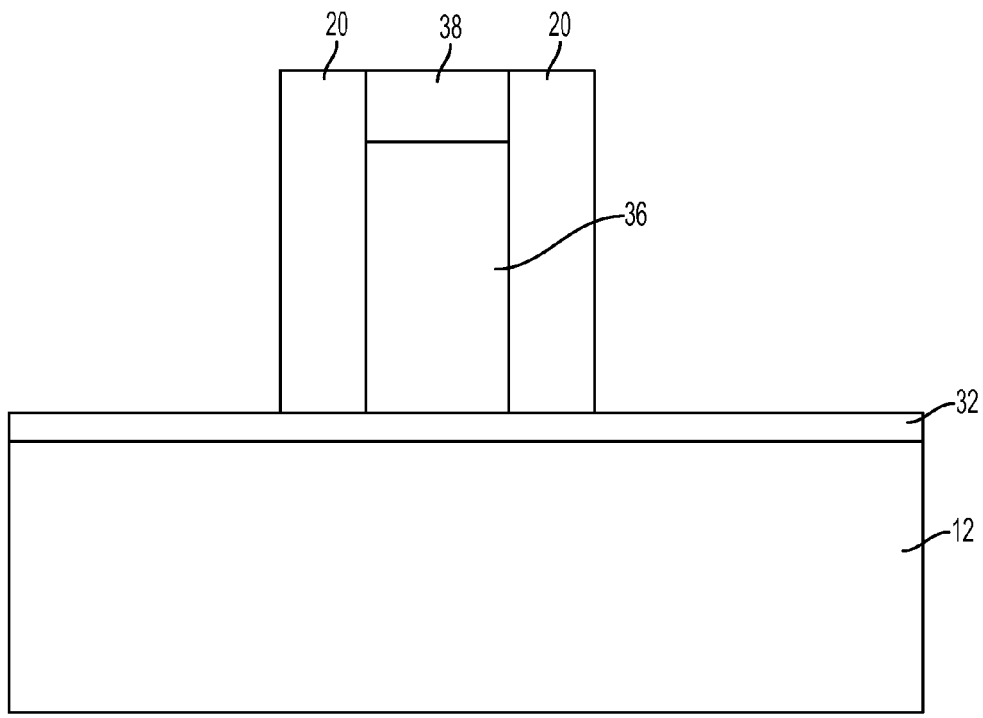

As illustrated in FIG. 4, gate spacers 20 are formed on the exposed side walls of the dummy gate stack 34. The gate spacers 20 may include $Si_3N_4$, SiBCN, SiNH, BN, or other suitable low-k dielectric material. The gate spacers 20 may include an insulator such as nitride, oxide, oxynitride, or combinations thereof. The gate spacers can be formed by any suitable deposition method, such as, but not limited to, chemical vapor deposition (CVD), plasma-assisted CVD, metal organic chemical vapor deposition, atomic layer deposition, evaporation, reactive sputtering, or chemical solution deposition, among others. After deposition, the gate spacers 20 may also undergo an etching process such as, but not limited to, reactive ion etching (RIE), isotropic or anisotropic etching, or chemical mechanical polarization (CMP).

The gate spacers 20 may have a width of about 3 nm to about 20 nm, for example, about 3 nm to about 10 nm.

Figure 5:
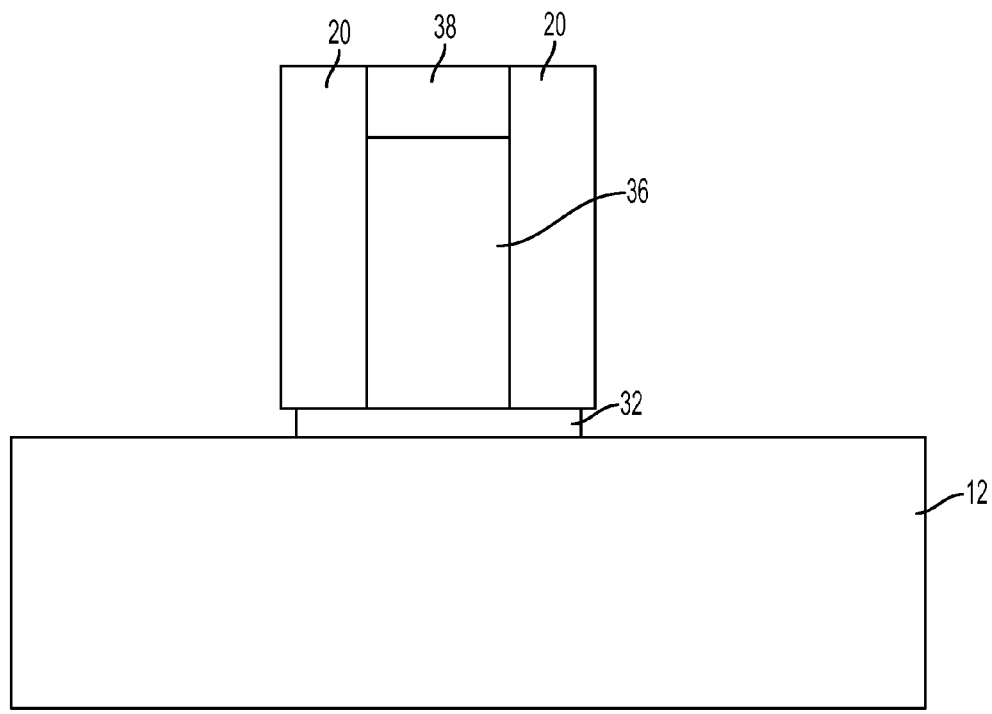

The method further includes removing a portion of the dummy oxide layer 32 from the surface of the semiconductor substrate 12, as shown in FIG. 5. In an example, the removing of the dummy oxide layer 32 forms an exposed surface of the semiconductor substrate on each side of the spacers 20. The exposed surface extends below a portion of each spacer 20. The dummy oxide layer 32 may be removed by any suitable method including, but not limited to, reactive ion etching (RIE), isotropic or anisotropic etching, or chemical mechanical polarization (CMP).

Figure 6:
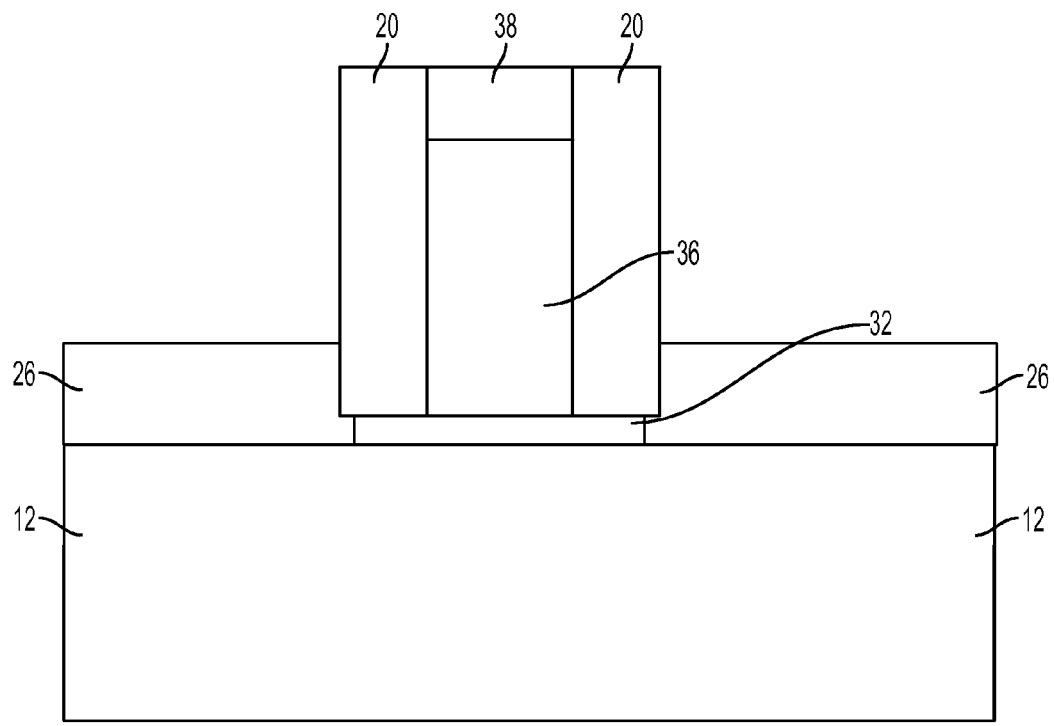

As illustrated in FIG. 6, source/drain regions 26 may be formed adjacent to the spacers 20. The source/drain regions 26 may be raised source/drain (RSD) regions that may be formed by a selective epitaxial growth process, wherein a semiconductive material is grown on the semiconductor substrate 12. Alternatively, the source/drain regions 26 may be added to the semiconductor substrate 12 by an ion-implant method.

In an example, RSD regions are formed adjacent to the gate spacers 20 by a selective epitaxial growth of silicon or germanium. The silicon may be single crystal, polysilicon, or amorphous. The germanium may be single crystal, polycrystalline, or amorphous. In an example, the RSD regions may be composed of SiGe.

At least one of the source/drain regions 26 may be doped with a p-type conductivity dopant. P-type semiconductor devices (PFETs) are typically produced by doping the source/drain regions with a p-type dopant comprising elements from group III of the periodic table of elements, including, but not limited to, boron, aluminum, gallium, indium, or alloys thereof. The source/drain region may include a p-type conductivity dopant concentration of about $2\times10^{20}$ atoms/cm$^3$ to about $2\times10^{21}$ atoms/cm$^3$. The p-type dopant may be introduced to the source/drain region in-situ during the selective epitaxial growth process. In an example, the p-type conductivity dopant may be introduced to at least one source/drain region by using ion implantations.

Figure 7:
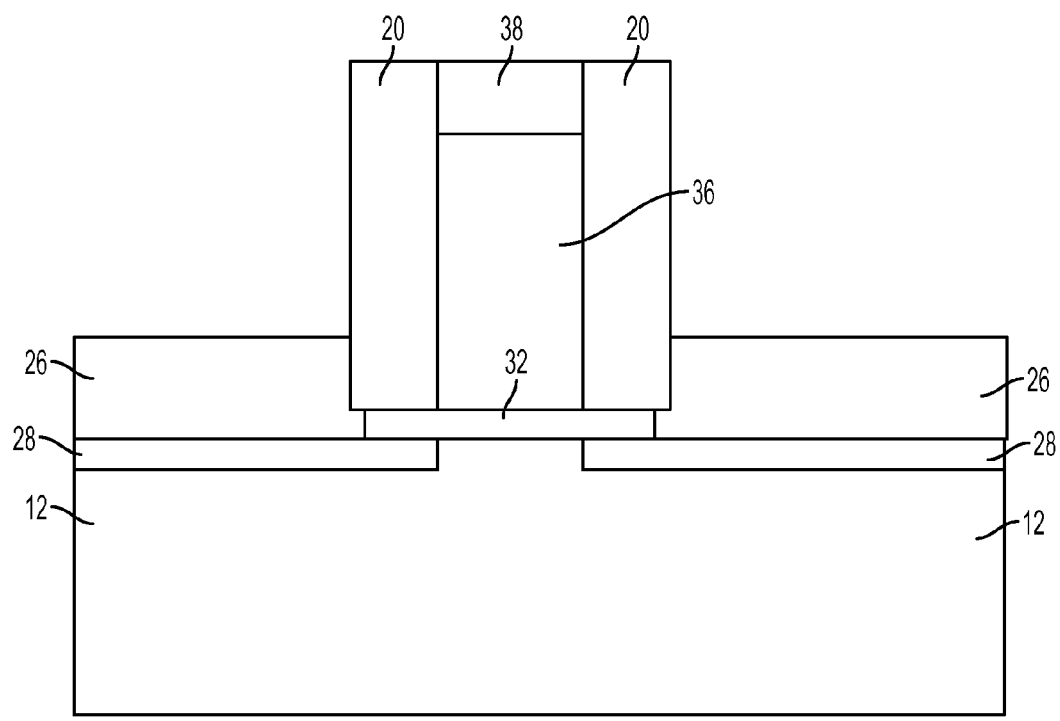

At least one of the source/drain regions may include an n-type conductivity dopant. N-type semiconductor devices (NFETs) may be produced by doping the source/drain regions with a dopant comprising elements from group V of the Periodic Table of Elements, including, but not limited to, phosphorus, antimony, arsenic, or alloys thereof. At least one of the source/drain regions may include the n-type conductivity dopant at a concentration of about $2\times10^{20}$ atoms/cm$^3$ to about $2\times10^{21}$ atoms/cm$^3$. The n-type dopant may be introduced to the source/drain region in-situ during the selective epitaxial growth process. In an example, the n-type conductivity dopant may be introduced to the at least one source/drain region by using ion implantations FIG. 7 illustrates an embodiment including the addition of a dopant drive-in 28 in contact with each of the source/drain regions. The dopant drive-in 28 may be formed by RTA, spike anneal, or any other suitable method.

Figure 8:
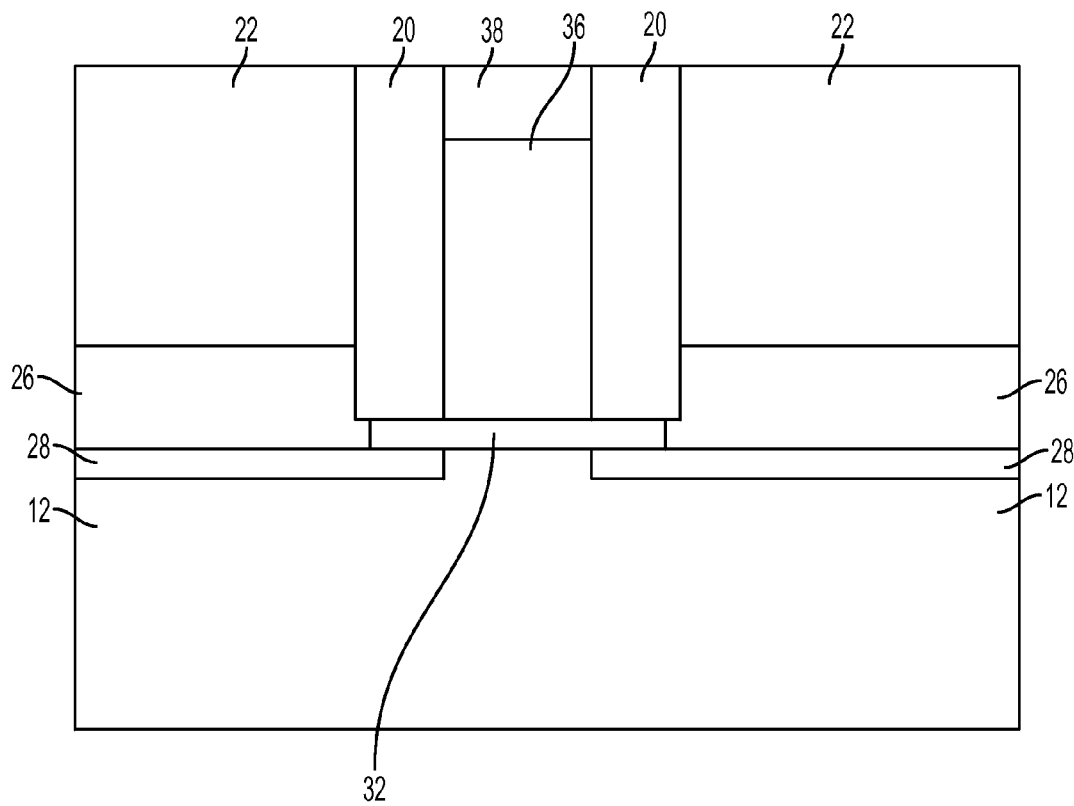

FIG. 8 illustrates the formation of an interlayer dielectric (ILD) layer 22. The ILD layer 22 may be deposited such that the ILD layer is adjacent to the source/drain region 26 and the gate spacers 20. In other words, as illustrated in FIG. 8, the ILD layer 22 may be deposited on an upper surface of the source/drain region 26. The ILD layer 22 may abut the outer side surfaces of the gate spacers 20. After deposition of the ILD layer 22, the top surface of the ILD layer 22 may be polished such that the top surface of the ILD layer 22 is at the same height as that of the dummy gate conductor 34.

The ILD layer 22 includes a dielectric material. The ILD layer 22 may include a low-k dielectric material including, but not limited to, an oxide, nitride, oxynitride, silicates including metal silicates, aluminates, titanates, and nitrides. The ILD layer 22 may include SiO$_2$, HfO$_2$, ZrO$_2$, Al$_2$O$_3$, TiO$_2$, La$_2$O$_3$, SrTiO$_3$, LaAlO$_3$, Y$_2$O$_3$, and combinations thereof. In an example, the ILD layer 22 may include a nitride, such as silicon nitride.

The ILD layer 22 may include a material with a dielectric constant of about 4.0 to about 7.0. For example, the ILD layer 22 may include boron nitride, carbon doped silicon oxide, fluorine doped silicon oxide, boron carbon nitride, hydrogen silsesquioxane polymer, methyl silsesquioxane polymer, polyphenylene oligomer, methyl doped silica, organosilicate glass, porous SiCOH, and combinations thereof.

The ILD layer 22 may have a thickness of about 5 nm to about 30 nm, for example, 10 nm to about 20 nm. The ILD layer 22 may be formed by chemical vapor deposition, (CVD), plasma-assisted CVD, metal organic chemical vapor deposition, atomic layer deposition, evaporation, reactive sputtering, chemical solution deposition, among other suitable methods. The IL layer 22 may be etched after deposition to a suitable thickness by RIE or chemical mechanical planarization followed by RIE.

Figure 9:
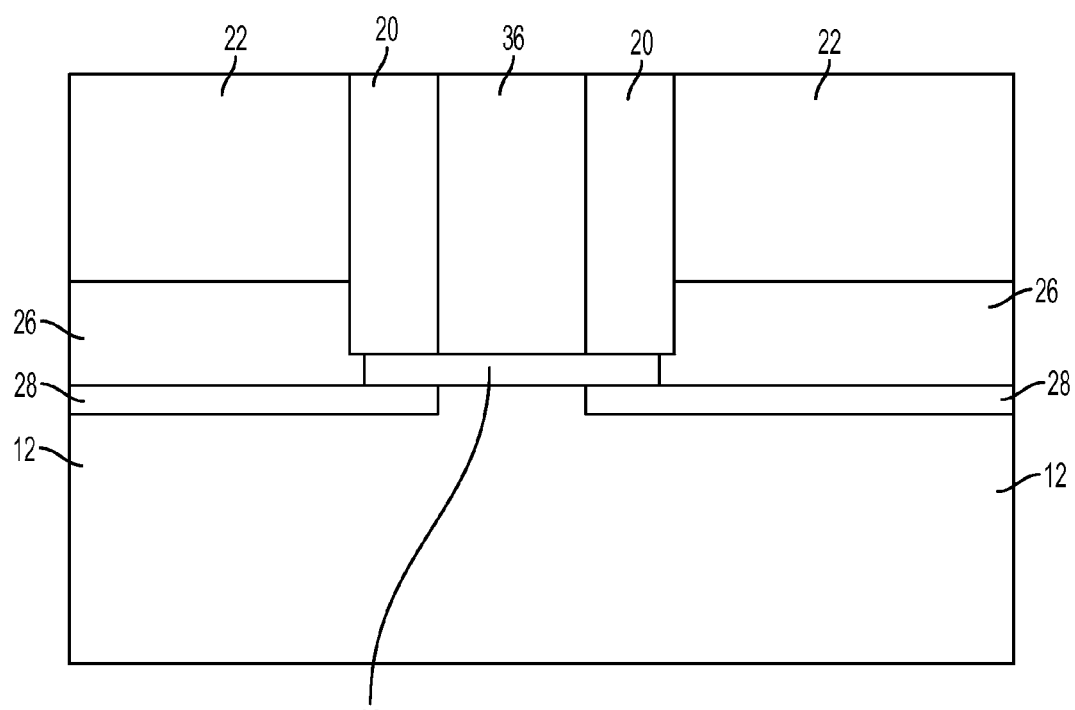

As illustrated in FIG. 9, in an example wherein the dummy gate stack 34 includes a high mobility channel material 38, the high mobility channel material 38 may be removed by a suitable method. For example, the upper surfaces of the ILD layer 22, gate spacers 20, and the high mobility channel layer 38 may be polished or etched such that the high mobility channel layer 38 is removed and the top surfaces of the gate spacers 20 and the ILD layer 22 is level with that of the top surface of the dummy gate stack base 36.

Figure 10:
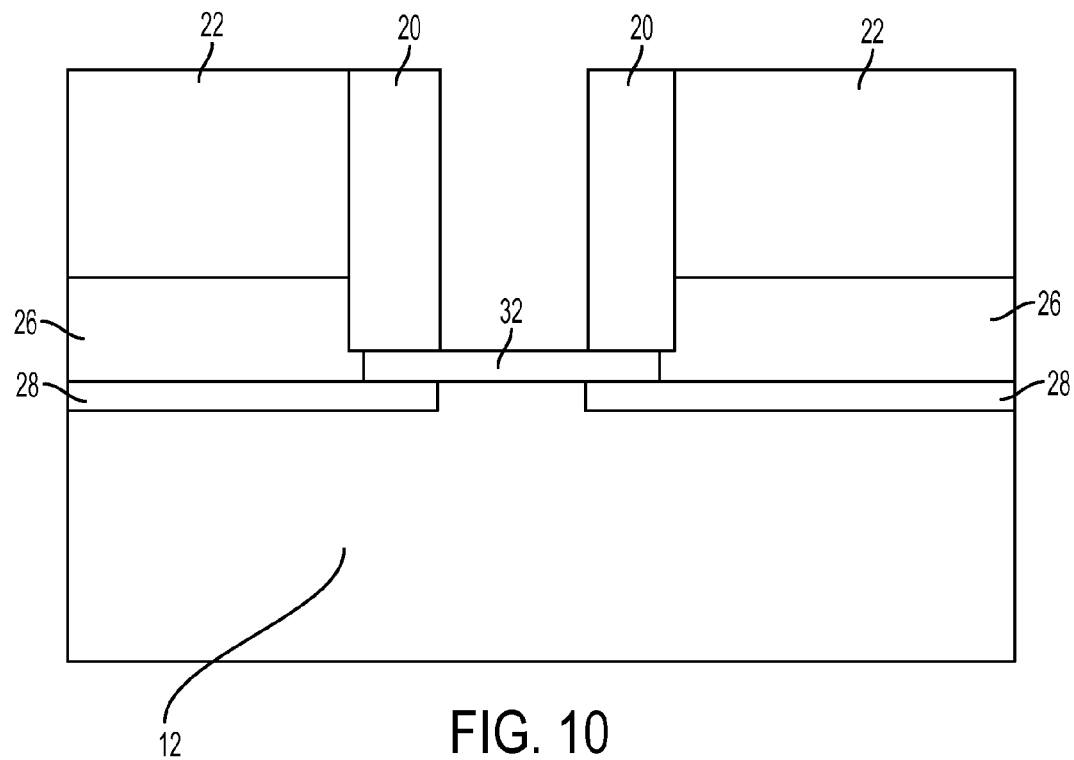

As shown in FIG. 10, the dummy gate stack 34 may be removed. In an example comprising a dummy gate stack 34 including the high mobility channel layer 38, the high mobility channel layer 38 and the dummy gate stack base 36 may be removed in the same step. The removal of the dummy gates stack 34 may include an etching process to form a void or open region that was inhabited by the dummy gate stack 34. For example, the dummy gate stack 34 may be removed by an etching process that is selective to the dummy gate stack 34. For example, the dummy gate stack 34 may be removed by isotropic wet or dry etch process. In an example wherein the dummy gate stack 34 includes an oxide, the etching process may be performed with an aqueous solution containing hydrofluoric acid. Other suitable removal techniques may include chemical dry etching and plasma etching.

Figure 11:
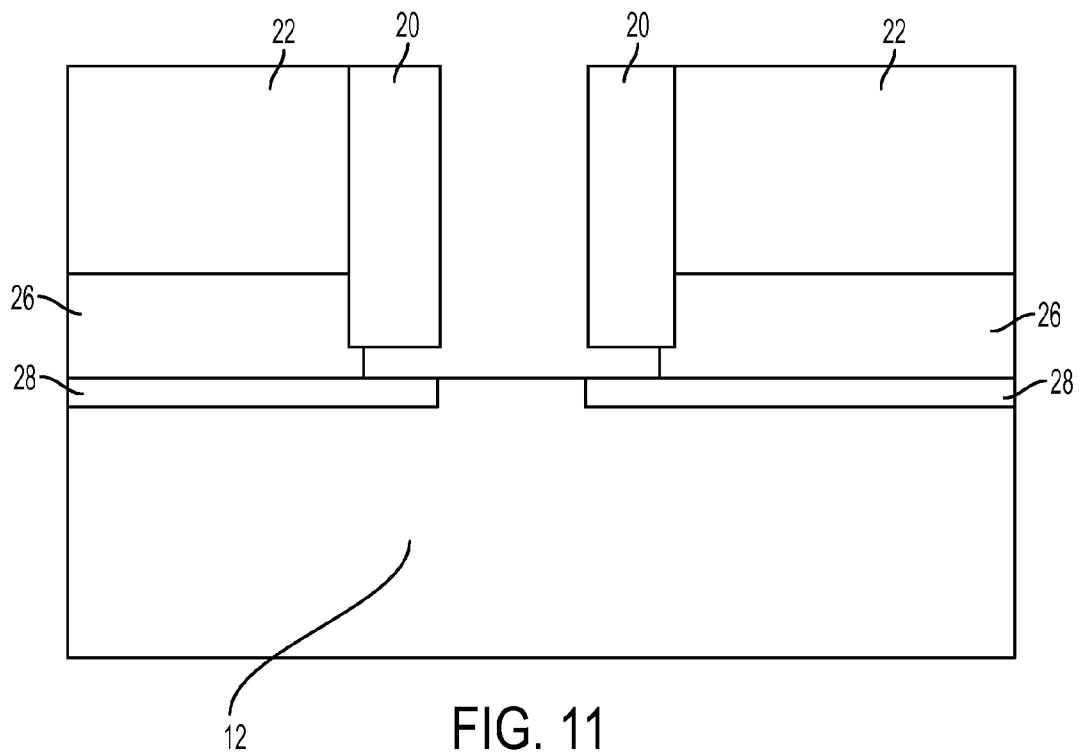

Further, as illustrated in FIG. 11, the dummy oxide layer 32 is removed. In an example, the dummy gate stack 34 and the dummy oxide layer 32 may be removed in the same step. The removal of the dummy oxide layer 32 may include an etching process to form a void or open region that was inhabited by the dummy oxide layer 32, wherein the void extends below at least a portion of the spacers 20. The dummy oxide layer 32 may be removed by an etching process that is selective to the dummy oxide layer 32. For example, the dummy oxide layer 32 may be removed by isotropic wet or dry etch process. In an example, the etching process may be performed with an aqueous solution containing hydrofluoric acid. Other suitable removal techniques may include chemical dry etching and plasma etching.

Figure 12A:
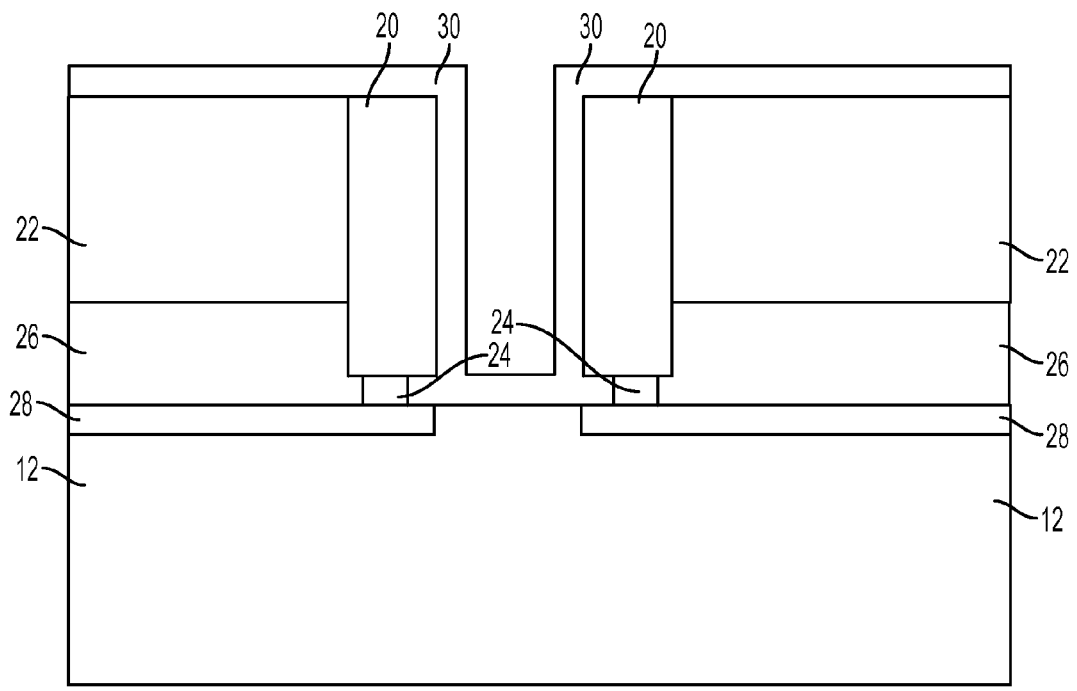
FIGS. 12a-12b is a cross-sectional view of the semiconductor device illustrating deposition of a low-k pinched off dielectric layer according to an embodiment.
Figure 12B:
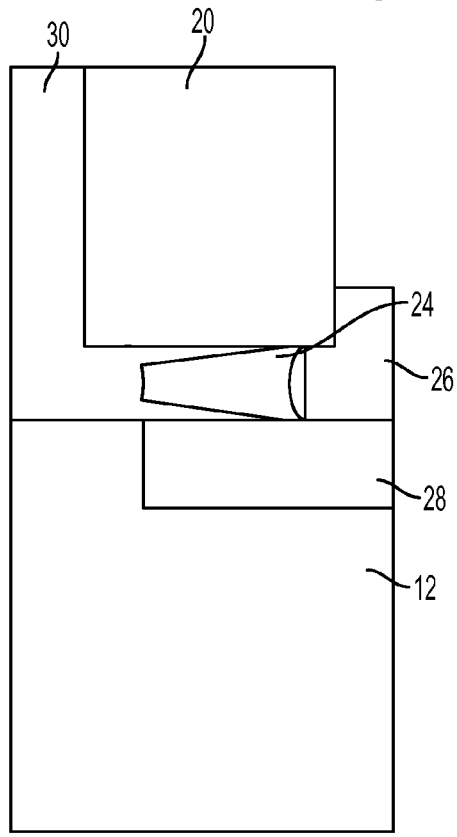

After the removal of the dummy oxide layer 32, a low-k dielectric layer 30 may be deposited on a portion of the exposed surface of the semiconductor substrate 12. Due to the geometry, this layer will pinch off leaving an air gap 24. As illustrated in FIGS. 12a-12b, the low-k pinched off dielectric layer 30 partially extends beneath a portion of each gate spacer 20 forming an air gap 24 between the low-k pinched off dielectric layer 30 and the source/drain region 26. The air gap 24 is also positioned between the bottom surface of each gate spacer 20 and the upper surface of the semiconductor substrate 12. In an example, the air gap 24 is positioned between the bottom surface of each gate spacer 20 and an upper surface of the dopant drive-in 28. In an example, the air gap 24 is sealed between a portion of the bottom surface of each gate spacer 20, the low-k pinched off dielectric layer 30, the semiconductor substrate 12, and at least one of the source/drain regions 26.

Figure 13:
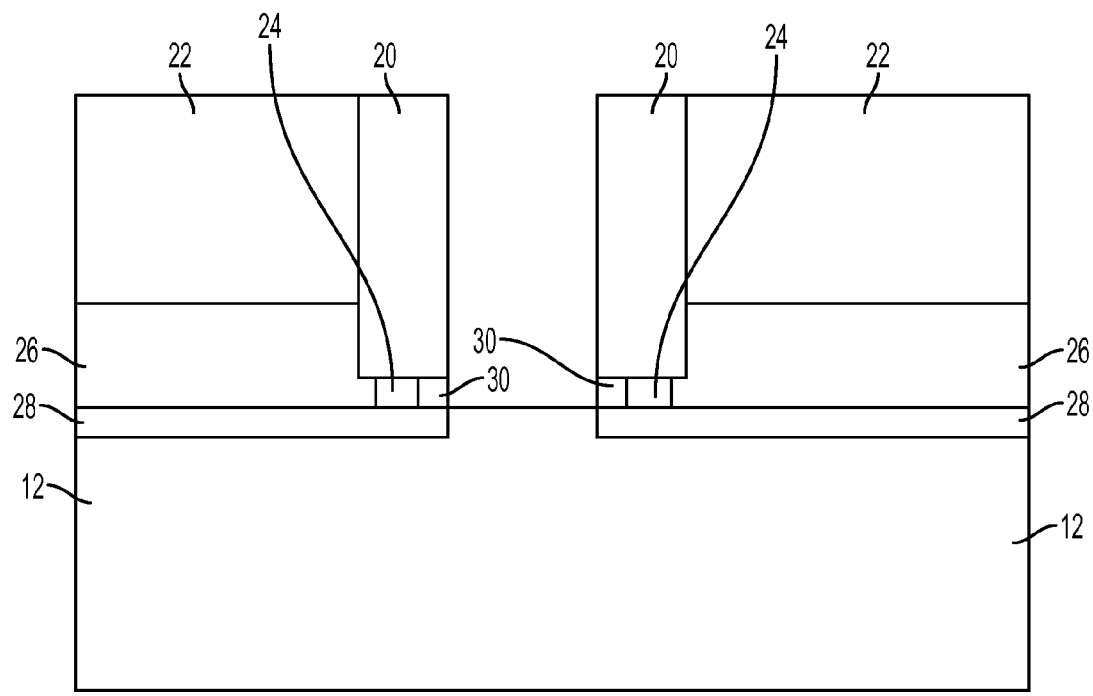

As illustrated in FIG. 13, a portion of the low-k pinched off dielectric layer may be removed to form an exposed surface of the semiconductor substrate, wherein the exposed surface is positioned between the inner surfaces of the gate spacers. In an example, the low-k pinched off dielectric layer may be removed from the inner surfaces of the gate spacers. In an example, the low-k pinched off dielectric layer may be removed except for a portion of the low-k pinched off dielectric layer 30 that remains between a portion of the bottom surface of the gate spacer 20, for example, the portion of the low-k pinched off dielectric layer 30 that remains between a portion of the bottom surface of the gate spacer 20 and the upper surface of the semiconductor substrate 12.

Figure 14:
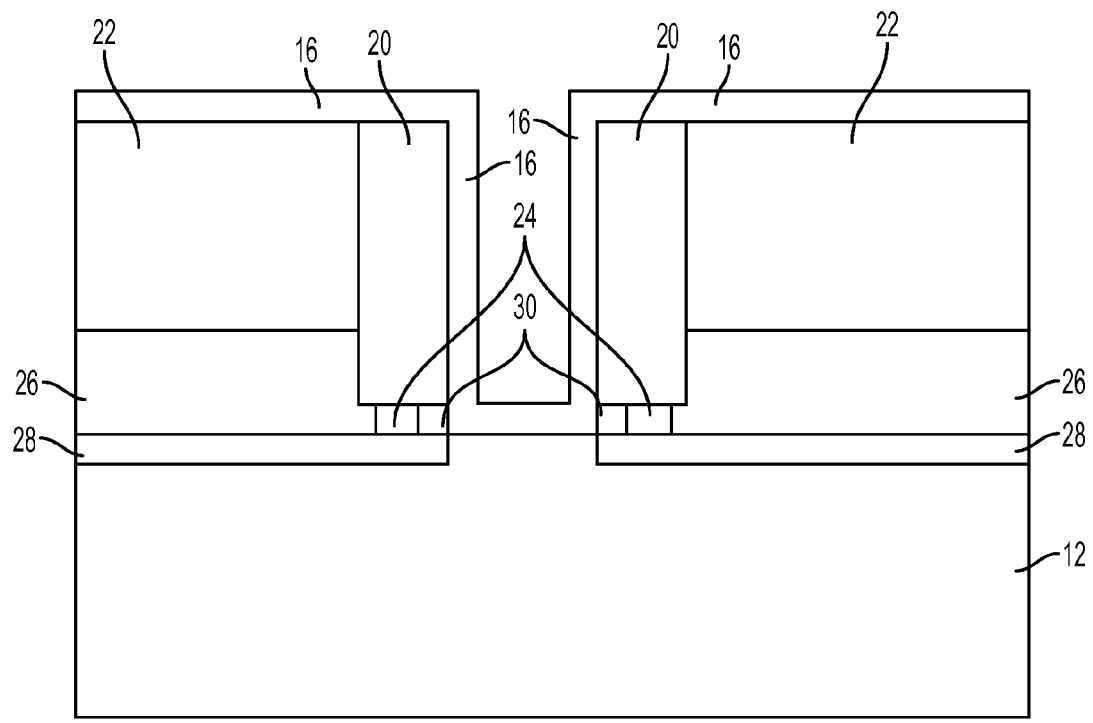

As shown in FIG. 14 and FIG. 1, a replacement gate stack 14 may be deposited in the void between the gate spacers 20. The method may include first depositing a gate dielectric layer 16 followed by the deposition of a gate conductor layer 18. The replacement gate stack may be etched or polished such that the upper surfaces of the ILD layer 22, gate spacers 20, and gate stack 14 are level, as shown in FIG. 1.

The gate stack 14 includes a gate conductor 18 and may include a gate dielectric layer 16. The gate stack 14 may be formed using deposition, photolithography, and selective etch processes. The gate stack 14 may be formed on the surface of the semiconductor substrate 12 by depositing at least one gate dielectric layer 16 on the semiconductor substrate 12, and then depositing at least one gate conductor layer 18 on the at least one gate dielectric layer 16. The gate stack 14 may be patterned and etched. For example, the gate stack 14 may be patterned by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process.

The gate dielectric layer 16 may include an oxide, nitride, or oxynitride of silicon. In an example, the gate dielectric layer 16 may include a high-k dielectric material that has a dielectric constant higher than the dielectric constant of silicon dioxide ($SiO_2$). In an example, the high-k dielectric material has a dielectric constant that is greater than 4.0. High-k dielectric materials suitable for the gate dielectric layer 16 may include, but not limited to, hafnium oxides, hafnium silicates, titanium oxides, barium-strontium-titanates, lead-zirconate-titanates, and combinations thereof. The gate dielectric layer 14 may be formed using any of several deposition methods and physical vapor deposition methods. The gate dielectric layer 16 may have a thickness of about 10 angstroms to about 200 angstroms.

The at least one gate conductor layer 18 may be formed using any suitable deposition method including, but not limited to, silicide methods, atomic layer deposition methods, chemical vapor deposition methods, and physical vapor deposition methods, such as, but not limited to, evaporative methods and sputtering methods. The gate conductor layer 18 may be multi-layered and containing more than one conductive material. The gate conductive layer 18 may include metals, metal alloys, metal nitrides, metal silicides, as well as laminates thereof. The gate conductor layer 18 may include any suitable conductive material including, but not limited to, W, Ni, Ti, Mo, Ta, Cu, Pt, Ag, Au, Ru, Ir, Rh, Re, and combinations thereof, including alloys of various combinations thereof. The gate conductor layer 18 may include doped polysilicon and/or polysilicon-germanium alloy materials having a dopant concentration ranging from about 1118 to about 1E22 dopant atoms per cubic centimeter. The gate conductor layer 18 may include polycide materials of doped polysilicon/metal silicide stack materials. The thickness of the gate conductor layer 18 may be about 10 nm to about 200 nm, for example, about 30 nm to about 150 nm, about 40 nm to about 150 nm, or about 50 nm to about 140 nm.

Deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography, nanoimprint lithography, and reactive ion etching.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor device, comprising:
   providing a semiconductor substrate;
   forming a dummy oxide layer on at least a portion of the semiconductor substrate;
   forming a dummy gate stack on a portion of the dummy oxide layer;
   forming gate spacers adjacent to the dummy gate stack;

removing a portion of the dummy oxide layer on each side of the gate spacers forming a remaining portion of the dummy oxide layer positioned beneath the dummy gate stack;

forming a source/drain region on each side of the gate spacers;

depositing an interlayer dielectric (ILD) layer on both sides of the gate spacers;

removing the dummy gate stack;

removing the remaining portion of the dummy oxide layer to form an exposed surface of the semiconductor substrate, wherein the exposed surface extends below a portion of each gate spacer;

applying a low-k pinched off dielectric layer to the exposed surface of the semiconductor substrate, wherein an air gap is formed between the source/drain region and the low-k pinched off dielectric layer;

removing a portion of the low-k pinched off dielectric layer between the gate spacers; and forming a replacement gate stack between the gate spacers.

2. The method of claim 1, wherein each air gap is completely sealed between the gate spacer, the source/drain region, the semiconductor substrate, and the low-k pinched off dielectric layer.

3. The method of claim 1, wherein depositing the ILD layer includes plasma enhanced chemical vapor deposition.

4. The method of claim 1, wherein the dummy gate stack includes an upper high mobility channel material layer.

5. The method of claim 1 further comprising forming dopant drive-in regions, wherein each dopant drive-in region is in contact with at least one of the source/drain regions.

6. The method of claim 1, wherein the source/drain regions are raised source/drain regions, wherein the source/drain regions include SiGe doped with an n-type dopant.

7. The method of claim 1, wherein the source/drain regions are raised source/drain regions, wherein the source/drain regions include SiGe doped with an p-type dopant.

8. The method of claim 1, wherein after depositing an ILD layer on both sides of the spacers, the method includes polishing the ILD layer such that a height of the ILD layer is level with a height of the dummy stack.

9. The method of claim 1, wherein the spacers include oxide, nitride, an oxynitride, or combinations thereof.

10. A semiconductive device comprising:
a semiconductor substrate;
a gate stack extending from the semiconductor substrate, wherein the gate stack includes a gate conductor layer;
at least two gate spacers adjacent to each side of the gate stack;
a source/drain region on each side of the spacers, wherein the source/drain regions are adjacent to the semiconductor substrate;
an ILD layer adjacent to outer surfaces of the two spacers, wherein a height of the ILD layer is level with a height of the gate stack;
an air gap positioned beneath each spacer; and
a low-k pinched off dielectric layer positioned between the semiconductor substrate and a bottom surface of each of the two gate spacers, wherein each air gap is positioned between a bottom surface of each gate spacer, the low-k pinched off dielectric layer, the semiconductor substrate, and the source/drain regions.

11. The semiconductor device of claim 10, wherein the source/drain regions are raised source/drain regions, wherein at least one of the source/drain regions include SiGe doped with an n-type dopant.

12. The semiconductor device of claim 10, wherein the source/drain regions are raised source/drain regions, wherein at least one of the source/drain regions include SiGe doped with a p-type dopant.

13. A semiconductive device comprising:
a semiconductor substrate;
a gate stack extending from the semiconductor substrate, wherein the gate stack includes a gate conductor layer;
at least two gate spacers adjacent to each side of the gate stack;
a source/drain region on each side of the spacers, wherein the source/drain regions are adjacent to the semiconductor substrate;
an ILD layer adjacent to outer surfaces of the two spacers, wherein a height of the ILD layer is level with a height of the gate stack;
an air gap positioned beneath each spacer;
a low-k pinched off dielectric layer positioned between the semiconductor substrate and a bottom surface of each of the two gate spacers, wherein the low-k pinched off layer is adjacent to the gate stack.

14. The semiconductor device of claim 13, wherein each air gap is sealed between a bottom surface of each gate spacer, the gate stack, the semiconductor substrate, and the source/drain region.

15. The semiconductor device of claim 13, further comprising dopant drive-in regions, wherein each dopant drive-in is in contact with at least one of the source/drain regions.

16. The semiconductor device of claim 13, wherein the source/drain regions are raised source/drain regions, wherein at least one of the source/drain regions include SiGe doped with an n-type dopant.

17. The semiconductor device of claim 13, wherein the source/drain regions are raised source/drain regions, wherein at least one of the source/drain regions include SiGe doped with a p-type dopant.

18. The semiconductor device of claim 13, wherein each air gap is positioned between a bottom surface of each gate spacer, the low-k pinched off dielectric layer, the semiconductor substrate, and the source/drain regions.

19. The semiconductor device of claim 13, wherein the gate spacers include oxide, nitride, an oxynitride, or combinations thereof.

* * * * *